(12) United States Patent
Glebov et al.

(10) Patent No.: US 6,343,265 B1
(45) Date of Patent: *Jan. 29, 2002

(54) SYSTEM AND METHOD FOR MAPPING A DESIGN MODEL TO A COMMON REPOSITORY WITH CONTEXT PRESERVATION

(75) Inventors: Alexander Gennadievich Glebov; Rebecca Mei-Har Lau, both of San Jose, CA (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/124,375

(22) Filed: Jul. 28, 1998

(51) Int. Cl.[7] .............................................. G06F 17/50
(52) U.S. Cl. ........................... 703/25; 703/27; 707/101; 717/2; 717/5
(58) Field of Search ........................ 703/25, 27; 707/6, 707/10, 100, 103, 101; 717/2, 5; 709/203, 328

(56) References Cited

U.S. PATENT DOCUMENTS

| | | | | |
|---|---|---|---|---|
| 5,596,746 A | * | 1/1997 | Shen et al. ................... | 395/612 |
| 5,627,979 A | * | 5/1997 | Chang et al. ................ | 395/335 |
| 5,787,437 A | * | 7/1998 | Potterveld et al. ........... | 707/103 |
| 5,848,273 A | * | 12/1998 | Fontana et al. .............. | 395/701 |
| 5,911,074 A | * | 6/1999 | Leprince et al. ............. | 395/703 |
| 5,950,201 A | * | 9/1999 | Van Huben et al. .......... | 707/10 |
| 5,960,199 A | * | 9/1999 | Brodsky et al. ............. | 395/704 |
| 5,966,707 A | * | 10/1999 | Van Huben et al. .......... | 707/10 |
| 6,012,058 A | * | 1/2000 | Fayyard et al. ................ | 707/6 |
| 6,023,578 A | * | 2/2000 | Birsan et al. ................ | 395/702 |
| 6,023,579 A | * | 2/2000 | Hellgren et al. ............. | 395/702 |
| 6,038,393 A | * | 3/2000 | Iyengar et al. .............. | 395/701 |
| 6,061,515 A | * | 3/2000 | Chang et al. ................ | 395/702 |
| 6,175,837 B1 | * | 1/2001 | Sharma et al. .............. | 707/103 |

OTHER PUBLICATIONS

Microsoft Visual Basic Technical Materials, White Paper, Microsoft Visual Modeler (http://www.microsoft.com).
IBM Component Broker Connector Overview; Analysis and Design (http://www.redbooks.ibm.com/SG242022/2022f168.htm#HDRAXAAD).

* cited by examiner

Primary Examiner—Kevin J. Teska
Assistant Examiner—Thai Phan
(74) Attorney, Agent, or Firm—David W. Victor; Konrad Raynes Victor & Mann LLP

(57) ABSTRACT

Disclosed is a system for mapping objects defined in a design model, such as an object oriented design model defined using a design language such as the Universal Modeling Language (UML), to a data model accessible to an application development tool. A design model is provided that includes at least two models. A first model includes a first class and a second model includes a second class. The first class and second class have the same name, and the first class and second class have at least one different attribute and method. The first model, the first class, and attributes and methods therein are mapped to a first data structure that indicates that the first class is included with the first model. The second model, the second class, and attributes and methods therein are mapped to a second data structure that indicates that the second class is included with the second model. In this way, the first class and the second class are distinguished according to their model in the data structures.

36 Claims, 8 Drawing Sheets

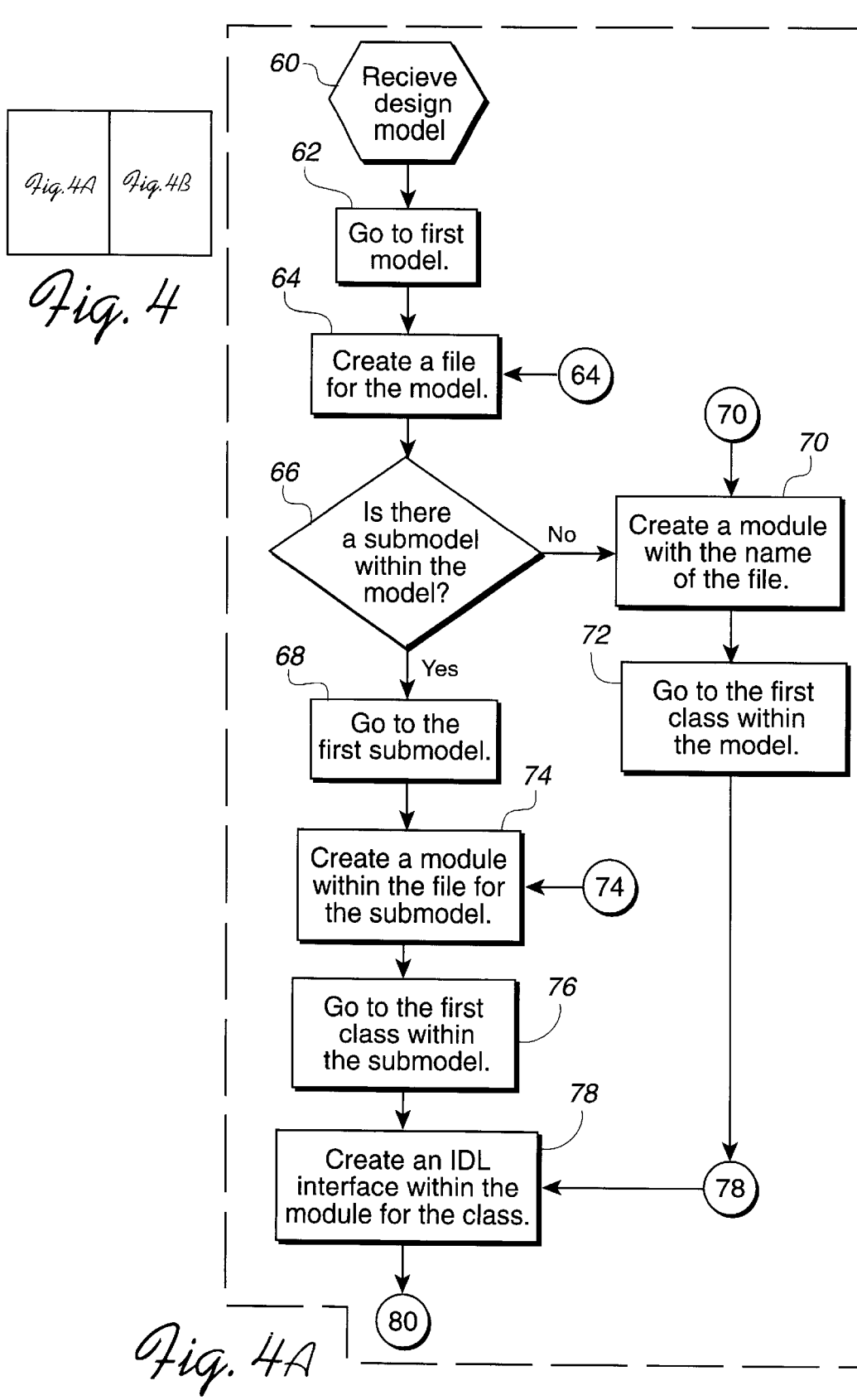

SYSTEM AND METHOD FOR MAPPING A DESIGN MODEL TO A COMMON REPOSITORY WITH CONTEXT PRESERVATION

BACKGROUND OF THE INVENTION

1. Field of the Invention

The present invention relates to a system and method for mapping a design model defining a problem space to a common repository accessible to application development tools in a manner that preserves contextual information of the model constructs and their properties.

2. Description of the Related Art

In object oriented analysis, design, and programming schemes, software developers define not only the data type of a data structure, but also the types of operations (functions) that can be applied to the data structure. In this way, the data structure becomes an object that includes both data and functions. Objects are abstract data types that define a real world entity to be manipulated and operated on within the object oriented programming environment. The functions included in an object are referred to as methods. In addition, programmers can define relationships among objects. Object-oriented programming techniques allow developers to create reusable modules that can interface and work with new objects added to the design. For instance, new objects can be made compatible with the current objects by having the new object inherit properties from existing objects. Object oriented programming languages include JAVA™, Smalltalk, and C++. JAVA is a trademark of Sun Microsystems, Inc.

An interface is a set of operations associated with an object that is used to access and manipulate the functions in the object. The interface operations are the only way to operate and affect the data for the abstract data type (object). Objects are further defined according to "class," which is an actual representation of an abstract data type, providing the properties and methods associated with the object. Instances of classes are called objects. An object instance of a class includes actual values for the data properties of the class. For instance, a class Employee may define attributes for an individual person, such as the name and social security number. In such case, an instance of the class employee includes the data for a particular employee. The behavior of an object refers to the methods or operations that apply to the data in the object.

Another object oriented concept is inheritance. Inheritance is the mechanism which allows an object of a certain class to inherit properties of another class. An object may inherit both the attributes and methods from another class. For instance, if class A inherits from class B, then B is called superclass of A; A is a subclass of B. Objects of a subclass can be used where objects of the corresponding superclass are expected.

Developers initially design an object oriented model using visual modeling tools that employ a graphical user interface (GUI). Visual modeling tools often support the unified modeling language (UML). Visual modeling tools include RATIONAL ROSE™, ERWIN, and the Microsoft Visual Modeler. RATIONAL ROSE is a trademark of Rational Software; ERWIN® is a registered trademark of Logic Works, Inc. FIGS. 1a and 1b illustrate a graphical interface from the Rational Rose modeling tool displayed on a computer terminal. The GUI displays the model constructs (e.g., submodels, classes, attributes, methods, class relationships, etc.) which make up the object-oriented model.

After the developer uses a visual modeling tool to model the object oriented environment, the design model may be converted to a common repository accessible to application development tools, which developers may use to modify and manipulate the object environment. International Business Machines Corporation (IBM), the assignee of the present patent application, provides the Component Broker product that includes bridge technology to transfer files from a visual modeling tool, such as Rational Rose, to a metadata format accessible to the IBM Object Builder program. The common repository maintains the metadata in a file.

FIGS. 1a and 1b illustrate two models, Model 1 and Model 2, displayed in the GUIs 2a, b of a visual modeling tool. These models have same named constructs, which in the example are same named classes, including Person, Car, and Truck. However, the same named constructs are defined with different method and data attributes in the different models. For instance, the Car object 4a in Model 1 has different data attributes and methods than the Car object 4b in Model 2. The Person 6a, b, Truck 8a, b, and Minivan 10a, b objects also have different attributes in Models 1 and 2.

Once the developer designs an object oriented model using a visual modeling tool, the model information must be mapped to the repository accessible to the application development tools. Current mapping techniques store the design information in a model file containing a subset or complete set of the model information. Unique named and same named model elements may be imported from different models into the common respository. One problem is that current mapping conventions do not maintain contextual information distinguishing classes having the same name in different models. With current mapping techniques, the attributes, properties, and relationships of classes in different models with the same name are stored under a single name interface for the class which combines the attributes from all the same named classes from the different models into a single class. Thus, current mapping methodologies do not distinguish class properties according to model or some other logical grouping of classes. For instance, two developers may define two different models including the identical class names, such as shown in FIGS. 1a, b. Current mapping techniques map the properties of the same named classes to a single class construct in the common repository, thereby losing all the distinctions for the class provided by the developers in their different models. Thus, with current mappings, the model context is lost when classes within different models have the same name.

FIG. 2 illustrates a GUI 12 that displays the results of mapping the design model data to the common repository with the current IBM Object Builder application development tool. Panel 14 in the GUI 12 shows that all the properties for class Car within both Models 1 and 2 have been mapped into a single class Car. By mapping the properties from classes having the same name in different models that have different properties, current mapping techniques eliminate the uniqueness of class properties (e.g., attributes and methods) between models. Current techniques, thus, effectively destroy the solution the developer provided to the real-world problem within the particular model.

SUMMARY OF THE PREFERRED EMBODIMENTS

To overcome the limitations in the prior art described above, the present invention discloses a system for mapping objects defined in a design model to a common repository.

A design model is provided that includes at least two models. A first model includes a first class and a second model includes a second class. The first class and second class have the same name, and the first class and second class have at least one different attribute and method. The first model, the first class, and attributes and methods therein are mapped to a first data structure that indicates that the first class is included with the first model. The second model, the second class, and attributes and methods therein are mapped to a second data structure that indicates that the second class is included with the second model. In this way, the first class and the second class are distinguished according to their model in the data structures.

Preferred embodiments provide a method for mapping design data defining objects in a modeling language such as UML to a common repository that is accessible to application development tools. With preferred embodiments, the mapping preserves distinctions in classes having the same name in different models. In particular, if classes located in separate models have the same name, then the preferred mapping would preserve the model context of the classes, including the method, attribute, and relationship distinctions for the same named model. In this way, the user definitions of a class and, hence, the initial modeling of the real-world problem is preserved. Moreover, preferred embodiments provide an improved GUI to view and better understand the layout of the initial design by displaying how classes with the same name belong to different models.

BRIEF DESCRIPTION OF THE DRAWINGS

Referring now to the drawings in which like reference numbers represent corresponding parts throughout:

FIGS. 4, 4A and 4B illustrate preferred logic to map a design model to metadata in the common respository in accordance with preferred embodiments of the present invention;

DETAILED DESCRIPTION OF THE PREFERRED EMBODIMENTS

In the following description, reference is made to the accompanying drawings which are part of the detailed description. These drawings show, by way of illustration, several embodiments of the present invention. It is understood that other embodiments may be utilized and structural and operational changes may be made without departing from the scope of the present invention.

HARDWARE AND SOFTWARE ENVIRONMENT

Figure 3:
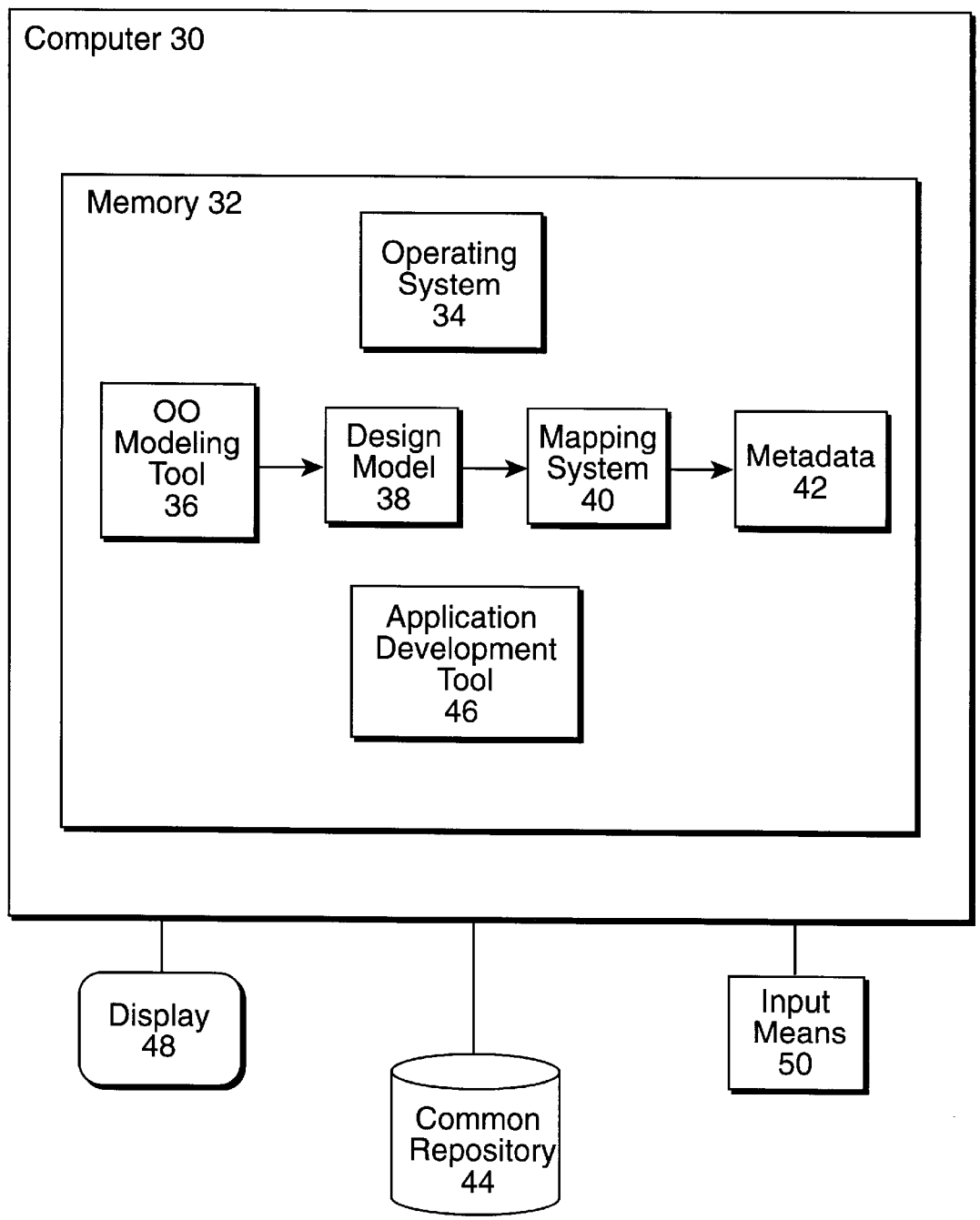
FIG. 3 illustrates a preferred hardware and software environment in which preferred embodiments of the present invention are implemented.

FIG. 3 illustrates a preferred hardware and software environment in which preferred embodiments of the present invention may be implemented. A computer 30 includes a memory 32. The computer 30 may be a personal computer, workstation, mainframe, etc. The memory 32 includes an operating system 34. The memory 32 may be any suitable volatile memory known in the art, e.g., RAM, DRAM, SRAM, etc., or a combination of volatile and non-volatile memory, e.g., hard disk drives, to provide storage space for programs and data, whether they are being executed or not. If the memory 32 is comprised of both volatile and non-volatile memory, then data may be paged and swapped between the volatile and non-volatile memories 32. The operating system 34 may be any suitable operating system such as AIX®, OS/390™, UNIX®, OS/2®, MVS™, WINDOWS®, etc. AIX and OS/2 are registered trademarks w of IBM; OS/390 and MVS are trademarks of IBM; WINDOWS is a registered trademark of Microsoft Corporation; UNIX is a registered trademark licensed by the X/Open Company LTD.

An object oriented ("OO") modeling tool 36 includes features typically found in OO modeling, analysis, and design tools used to design component objects. Developers use the OO modeling tools to identify and define the application requirements and functionality for the application program. The next step in the development process is to develop the architecture and design for the application program based upon the requirements and functionality developed during the analysis. The architecture and design breaks the requirements and functionality down into modules or basic elements. The developer starts with a high level design and refines the design into lower levels to include more detail. The developer designs objects and classes in an attempt to define real world problem spaces as program objects. For example, the developer first designs objects in classes at a high level and identifies relationships between the objects and classes. The developer then expands the initial architecture and design to a more detailed architecture and design.

Figure 1A:
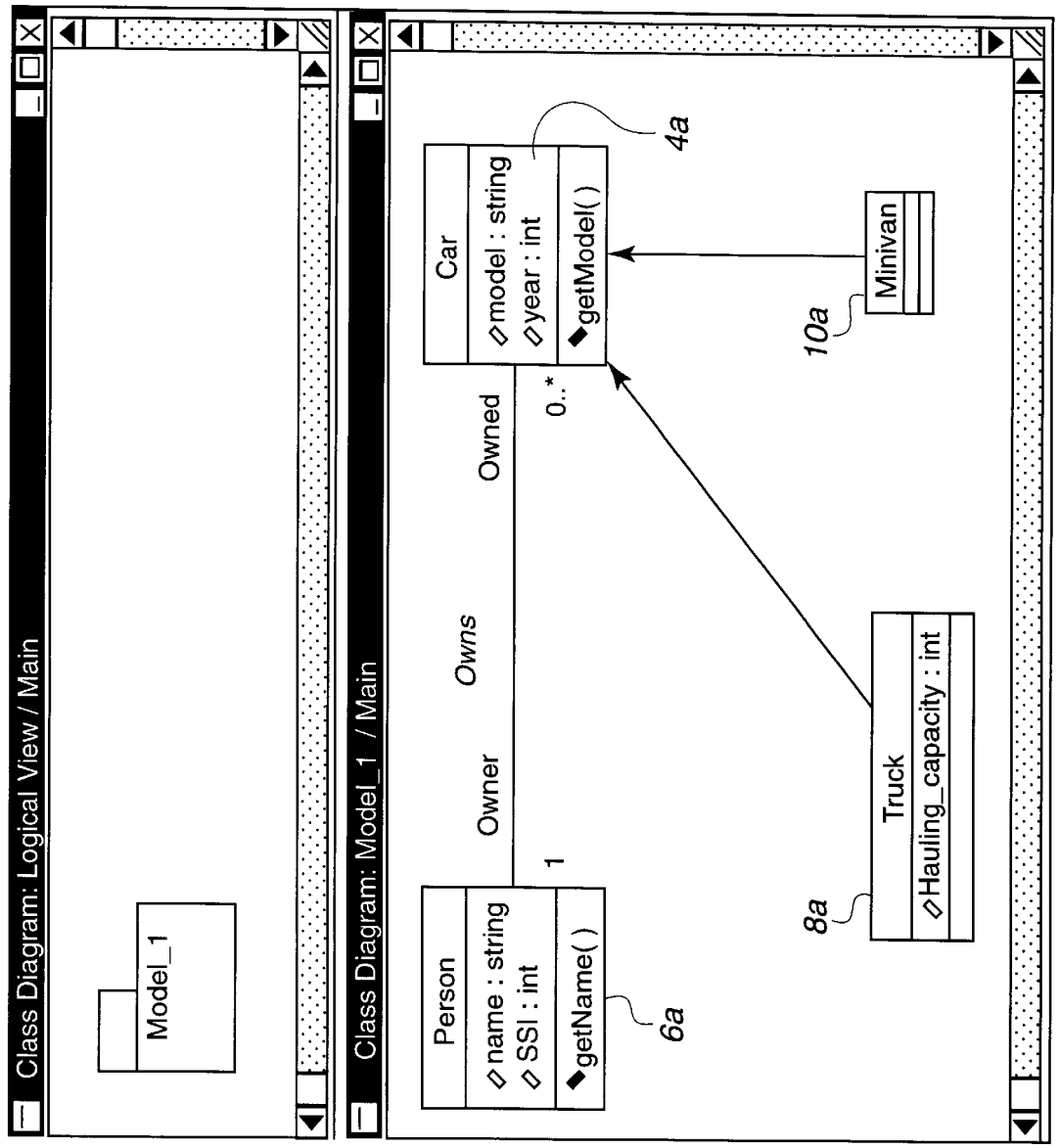
FIGS. 1a, b illustrate the GUI displayed by a visual modeling tool used to design objects.
Figure 1B:
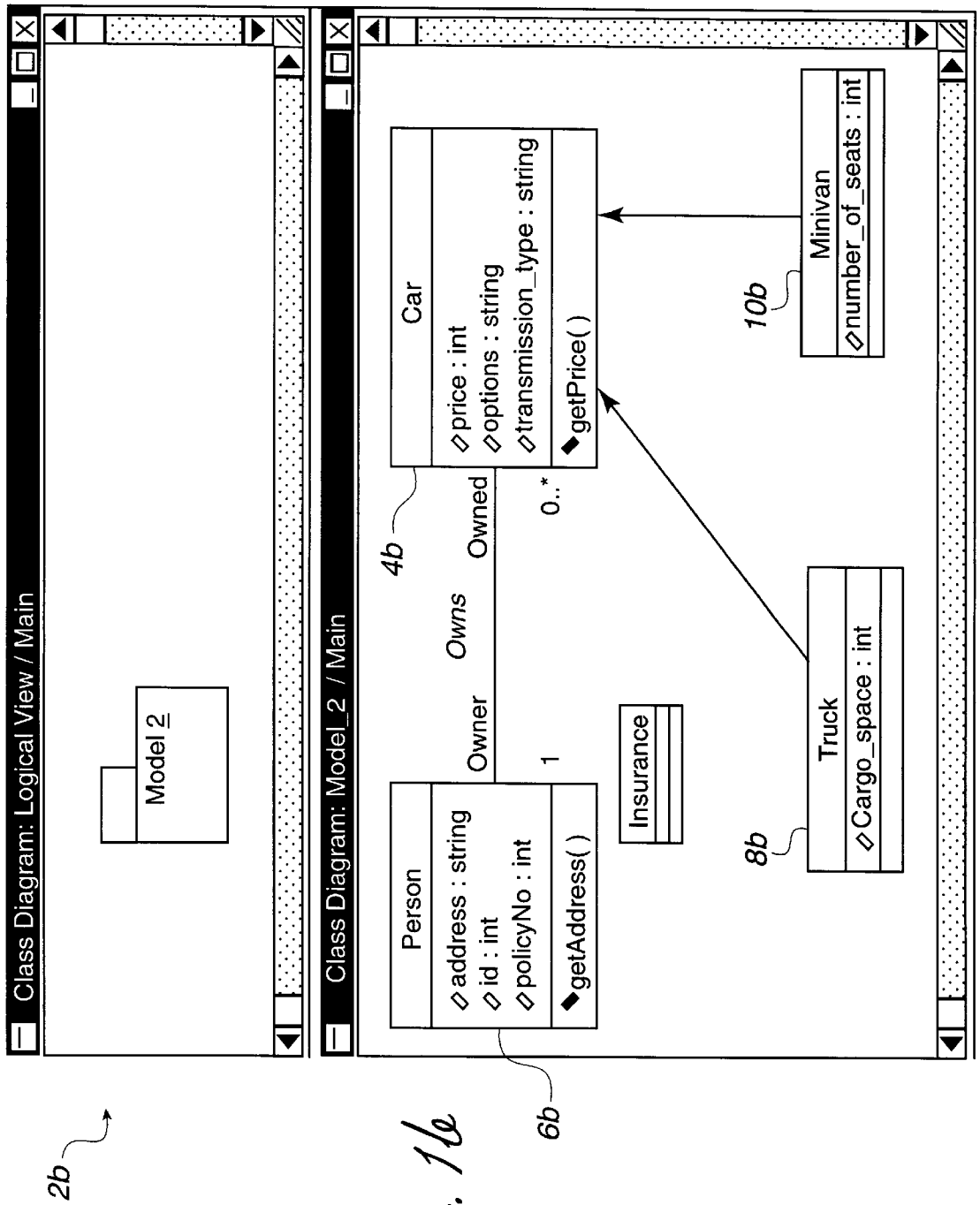
Figure 2:
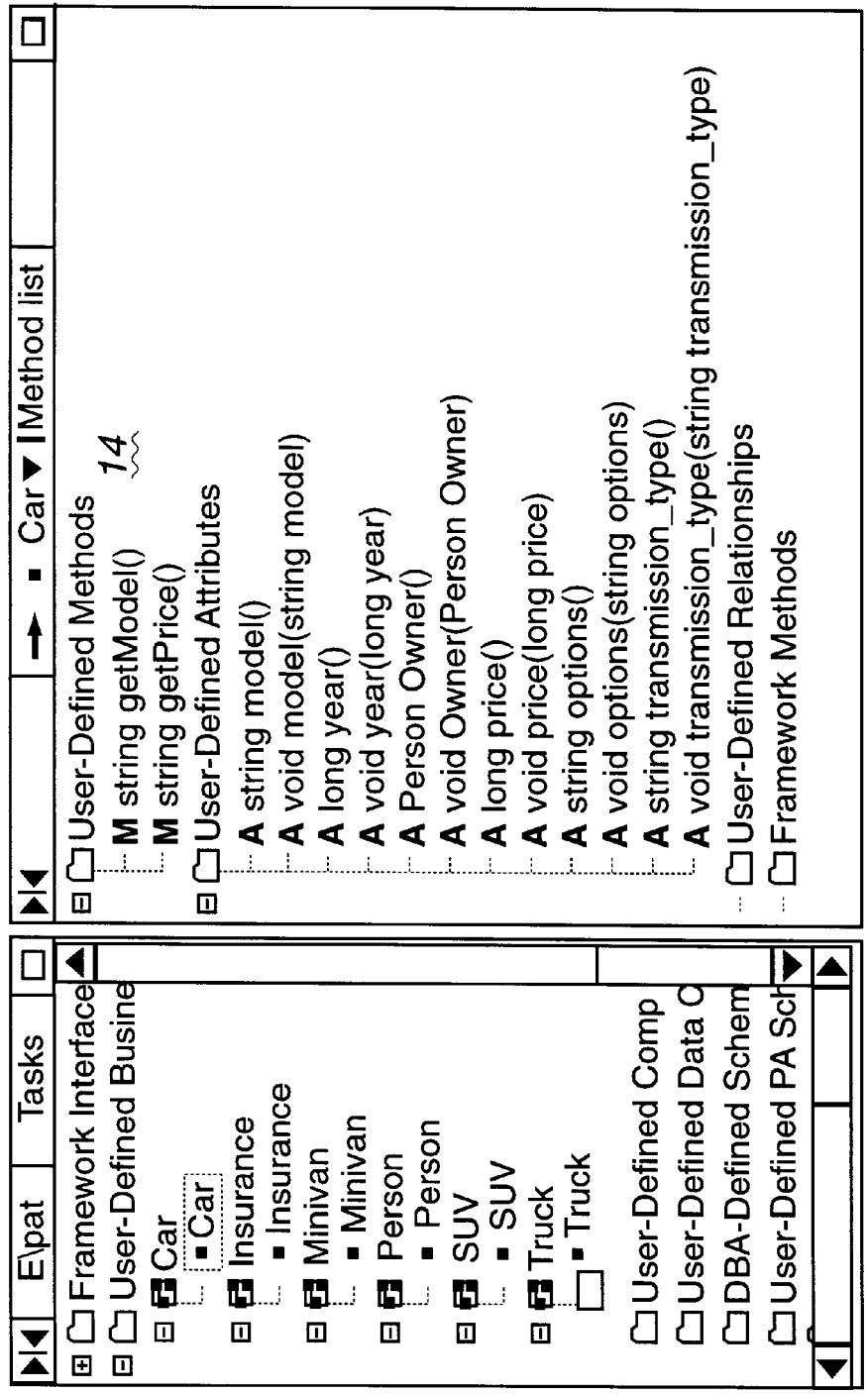
FIG. 2 illustrates a GUI displaying how the models shown in FIGS. 1a, b are maintained in the common repository using current mapping techniques.

In this initial design mode involving the OO modeling tool 36, the developer may also introduce classes, attributes, and methods to the design. Finally, the developer may identify relationships between the classes. With reference to FIG. 1 a, the developer would use the OO modeling tool 36 to define the classes Person, Car, Truck, the attributes within each class, and the relationship between the classes as indicated by the graphical arrows. As part of defining relationships between classes, the developer may also introduce inheritance into the relationships. The OO modeling tool 36 may be any suitable modeling tool known in the art, such as Rational Rose and others.

The OO modeling tool 36 produces a design model 38, which may conform to the UML specification. A mapping system 40 maps the data in the design model 38, which provides the initial definition of the objects, to metadata 42 that is then retained in a common repository 44. This mapping system 40 may be part of the OO modeling tool 36 or a bridge type of technology, such as the bridge technology provided with the IBM Component Broker that maps a model to metadata 42 in a common format such as the XML (Extended Markup Language), the Interface Definition Language (IDL), UML, etc. The metadata 42 includes interfaces that provide a listing of the operations and attributes of the object as well as mappings to other model constructs. The common repository 44 can generate XML, IDL or other file formats such as Java files by reading the metadata. The common repository 44 may store the metadata in a single file, multiple files or any other data structure or combination of data structures known in the art.

The developer may use an application development tool 46 to modify and manipulate the metadata 42 in the common repository 44 to develop and implement the objects defined therein to complete the design process. The application development tool 46 may create server objects that are capable of messaging and communicating with other objects and provide application adaptors to allow the object to interface with popular application programs such as database programs. The application development tool 46 may be any suitable application tool that refines business objects in a multi-tier environment, such as the IBM Object Builder.

The common repository 44 provides a non-volatile storage for the metadata 42 and other interface information. The computer 30 may be a client computer in a network environment and the common repository 44 may be located in a server accessible to the client computer 30 over a network communication line. Alternatively, the common repository 44 may be a local storage area within the computer 30. In preferred embodiments, the common repository 44 may be any suitable non-volatile storage device known in the art, such as direct access storage devices (DASD), hard disk drive, optical disk, CD-ROM, magnetic tape, holographic units, etc.

A user controls computer 30 operations via a display 48, which may be any suitable display device known in the art, and an input means 50, which may be a data file keyboard, mouse, pen-stylus, voice activated input, etc. The user controls the OO modeling tool 36 and application development tool 44 with the input means 42 and a graphical user interface (GUI) displayed on the display 40.

The Mapping System

The mapping system 40 converts the design model 38 containing user defined model elements to metadata 42 stored in the common repository 44. Mapping systems are described in U.S. Patent Application entitled "Systems, Methods and Computer Program Products for Generating an Object Oriented Application for an Object Oriented Environment," to Dorian Birsan, Christina Lau, and Harm Sluiman, Ser. No. 08/853,208, filed May 9, 1997, and assigned to IBM, which application is incorporated herein by reference in its entirety.

In preferred embodiments, the mapping system 40 maps Models defined by the OO modeling tool 36, i.e., the design model 38, to a File. Likewise, the mapping system 40 maps Packages defined by the OO modeling tool 36, i.e., the design model 38, to a Module contained in the File of the common repository 44. A Class corresponds to an Interface contained within the Submodel. The design model 38 includes one or more packages that group classes. A package may be empty or comprised of one or more classes or packages (i.e., subpackages), which in turn comprise one or more classes. Packages partition the model into at least two parts (i.e., classes within the package and classes outside the package). The package may comprise a second package which is contained in the first package. The second package comprises at least one class, and partitions the greater package into at least two parts. As used herein, the term "model" refers to a first package and the term "submodel" refers to a subpackage, wherein the models and submodels (packages and subpackages) provide logical groupings of classes within an object oriented design environment.

The mapping system 40 of the preferred embodiment first maps the model to a File, such as an XML, IDL, or IML file, then maps a submodel, i.e., a package within the model, into a Module within the File. The mapping system 40 then maps the Class to an Interface within the Module. If there are no Submodels, the Model is mapped to the Module, thus providing a second level of context before the classes are mapped to the interfaces. The mapping system 40 further maps class specifications, relationships and inheritances, internal structure of classes, attributes and methods from the design model 38 to the common repository 44.

Below is a preferred mapping implemented in the mapping system 40.

Model→File
    Submodel (or model)→Module
        Class→Interface
            Attribute→Attribute
            Method→Method
            Inheritance→Inheritance
            Event→Event In preferred embodiments, a particular model is mapped to a File. A submodel or package of classes included within the model is mapped to a Module within the file. By providing a submodel or package as the Module at the next level, submodel context is provided when there are two same named classes in different submodels of the same model. If there is no submodel level in the model, then the model would be mapped to the Module. A Class is mapped to an Interface within the File. The contents of the Class construct are mapped at a lower level within the particular Class Interface. An Attribute of the Class is mapped to an Attribute of the Class Interface; a Method of the Class is mapped to a Method of the Class Interface; and an Event is mapped as an Event of the Class Interface. In preferred embodiments, a meta table in the common repository 44 maintains relationship information, including inheritance information, for the different class interfaces. The meta table indicates the relationship each class has with the other classes. The meta table may include an entry for each class and, for each class therein, a pointer to the super classes from which that class inherits attributes.

Figure 4B:
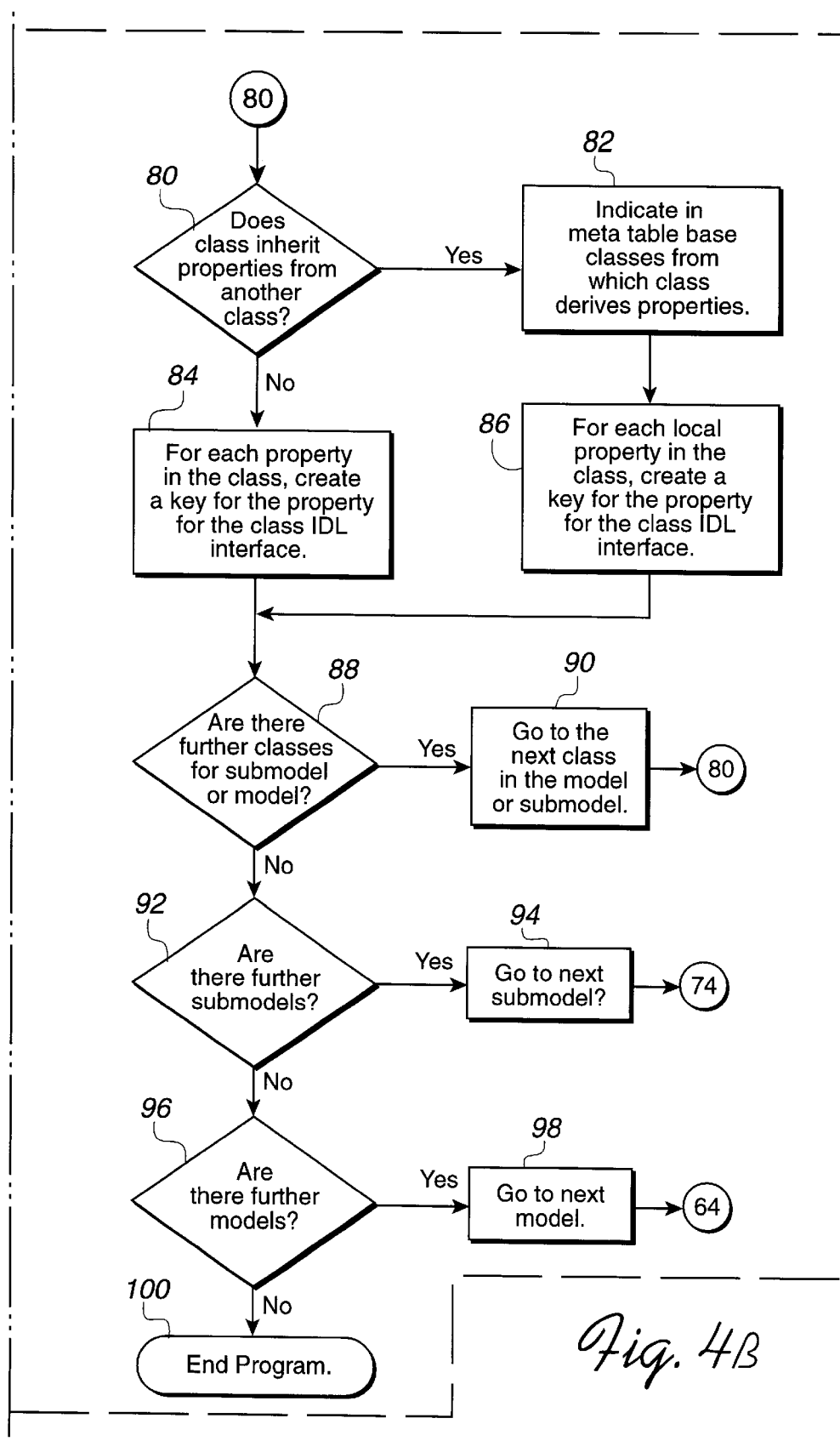

FIG. 4 illustrates logic embedded in the mapping system 40 and executed by the computer 30 running the mapping system 40 to map the components of a design model 38 into the common repository 44. Control begins at block 60 which represents the mapping system 40 receiving a design model 38. Control transfers to block 62 which represents the mapping system 40 scanning the first model in the design model 38 and then proceeding to block 64 to create a file for the model. Control transfers to block 66 which is a decision block representing the mapping system 40 determining whether there is a submodel within the model. If so, control transfers to block 68; otherwise, control transfers to block 70. Block 70 represents the mapping system 40 creating a module within the file created at block 64 with the name of the model and then proceeding to block 72 to go to the first class within the model. If there is at least one submodel for the model, then control transfers to block 74 which represents the mapping system 40 creating a module within the file created at block 64 for the submodel and then accessing the first class within the submodel at block 76.

After accessing the first class, at blocks 72 or 76, control transfers to block 78 which represents the mapping system 40 creating an IDL interface within the module created at blocks 70 or 74 for the class accessed at blocks 72 or 76. Control then transfers to block 80 which represents the mapping system 40 determining whether the class inherits properties from another class. If so, control transfers to block 82 to indicate in the meta table the base classes from which the current class derives properties. In alternative embodiments, inheritance may be indicated by alternative programming means. The mapping system 40 then proceeds to block 86 to create a keyword and field in the class interface for each local property in the class, i.e., a property of the class that is not inherited. If the class did not inherit properties from another class, then at block 84, the mapping system 40 creates, for each property in the class, a keyword and field for the property in the class interface. From blocks 84 and 86, control transfers to block 88 which represents the mapping system 40 determining whether there are any further classes for the submodel or model. If so, control transfers to block 80 et seq. to map the next class.

If there are no further classes, then control transfers to block 92 which represents the mapping system 40 determining whether there are further submodels. If so, control transfers to block 94 to proceed to the next submodel and then back to blocks 74 et seq. to map the submodel. If there are no further submodels, then control transfers to block 96 which represents the mapping system 40 determining whether there are further models. If so, control transfers to block 98 to access the next model and then back to block 64 et seq. to map the contents for the next model. Otherwise, if there are no further models, control transfers to block 100 which represents the end of the program.

The logic of FIG. 4 would map Models 1 and 2 in FIGS. 1 *a, b* as follows:
File::Model 1
  Module::Model 1
    Interface::Person
      Attribute::name
      Attribute::SSI
      Method::getName( )
    Interface::Car
      Attribute::model
      Attribute::year
      Method::getModel( )
    Interface::Truck
      Attribute::Hauling_capacity
    Interface::Minivan
File::Model 2
  Module::Model 2
    Interface::Person
      Attribute::address
      Attribute::id
      Attribute::policyNo
      Method::getAddress( )
    Interface::Car
      Attribute::price
      Attribute::options
      Attribute::transmission_type
      Method::getPrice( )
    Interface::Truck
      Attribute::Cargo_space
    Interface::Minivan
      Attribute::number_of_seats The mapping system 40 would further indicate in the meta table the class inheritance for truck and minivan in Models 1 and 2. Note, that in preferred embodiments, the mapping system 40 does not map the inherited properties to the data model 40. Instead, inherited properties are indicated in the meta table. The mapping provides context for the classes according to the model or submodel in order to preserve the class meanings in context when different models or submodels have same named classes.

Figure 5:
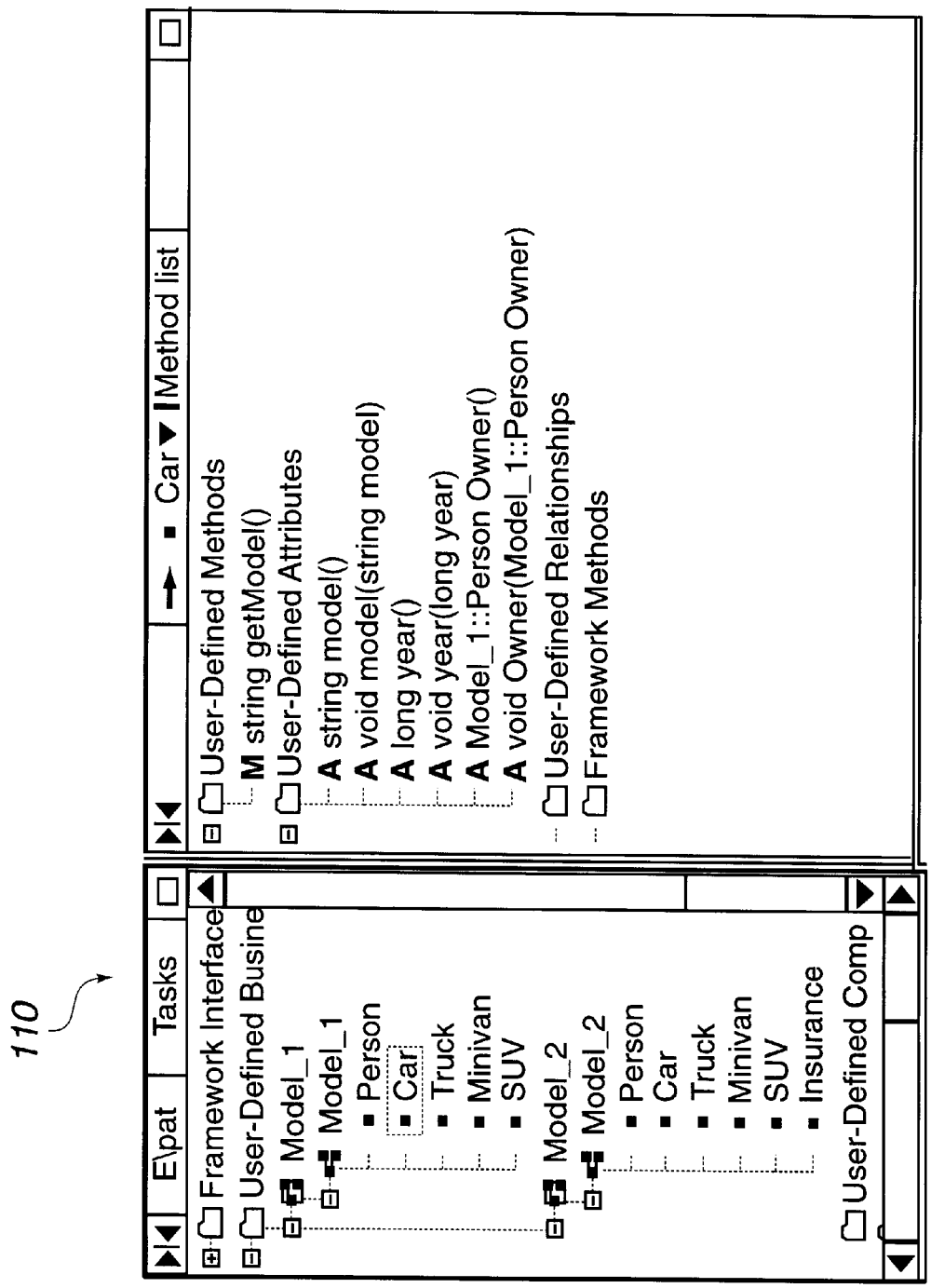
FIG. 5 illustrates a GUI displaying how the models shown in FIGS. 1a, b are mapped to the common repository in accordance with preferred embodiments of the present invention.
Figure 6:
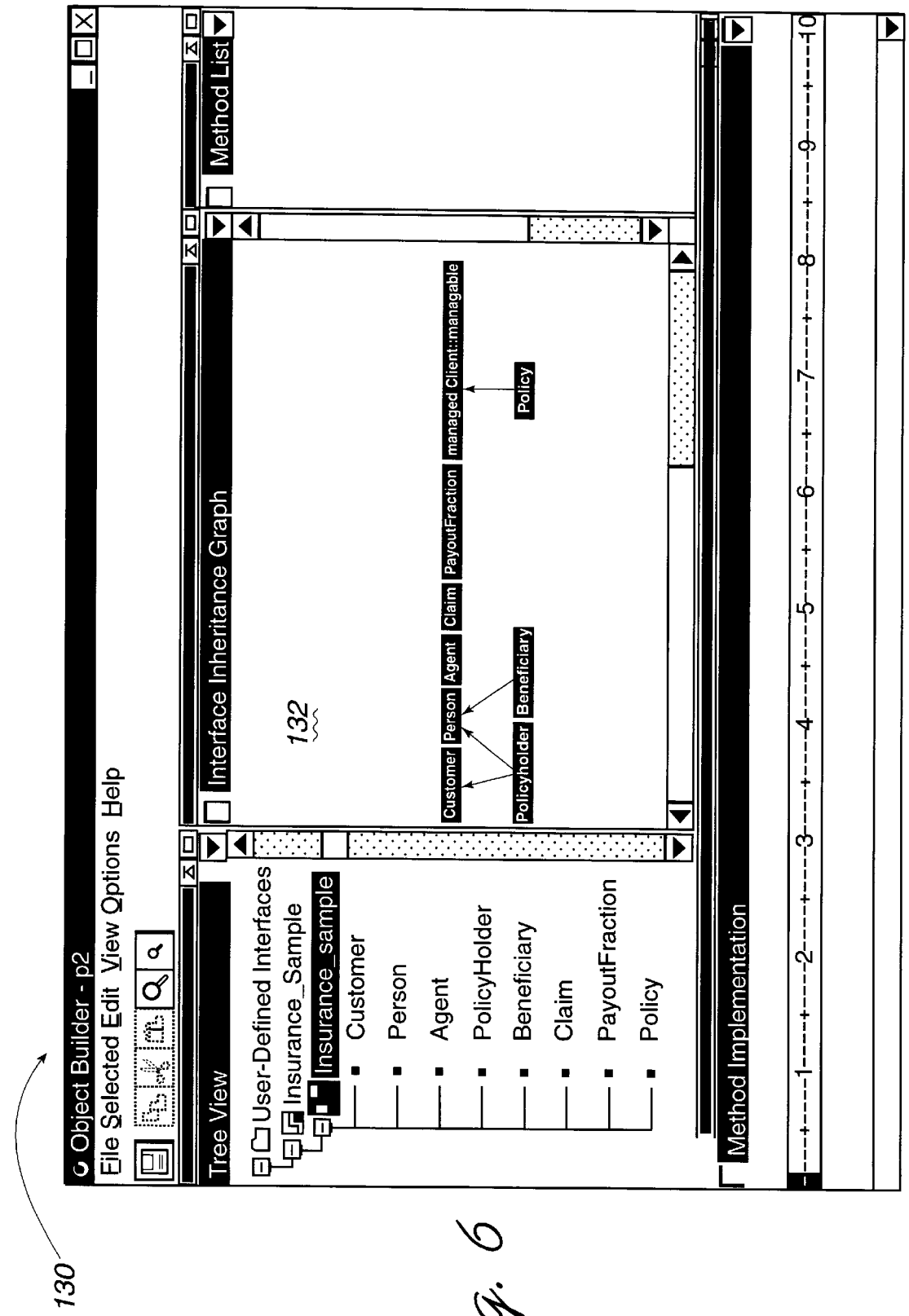
FIG. 6 illustrates how inheritance information may be displayed in a GUI.

FIGS. 5 and 6 illustrate GUIs displayed in the display 48. FIG. 5 illustrates a GUI 110 displaying the contents of the metadata in the common repository 44 in which the objects of FIGS. 1*a, b* were mapped according to the logic of FIG. 4. This GUI 110 illustrates how the model context for the classes was maintained. The attributes for the class car in Model 1 are maintained just as they are maintained in the design model 38 shown in FIG. 1*a*.

FIG. 6 illustrates a GUI 130 which has a window pane 132 displaying a graphical representation of the inheritance relationship among the classes. The user may select an option to display such inheritance information from the inheritance information maintained in the meta table discussed above.

Accordingly, the preferred mapping system 40 of FIG. 4 preservers complete model and submodel context information so that the context and definition of models and submodels which include the same class name are preserved.

CONCLUSION

This concludes the description of the preferred embodiments of the invention. The following describes some alternative embodiments for accomplishing the present invention.

The preferred embodiments may be implemented as a method, apparatus or article of manufacture using standard programming and/or engineering techniques to produce software, firmware, hardware, or any combination thereof. The term "article of manufacture" (or alternatively, "computer program product") as used herein is intended to encompass one or more computer programs and data files accessible from one or more computer-readable devices, carriers, or media, such as a magnetic storage media, "floppy disk," CD-ROM, a file server providing access to the programs via a network transmission line, holographic unit, etc. Of course, those skilled in the art will recognize that many modifications may be made to this configuration without departing from the scope of the present invention.

The embodiment of FIG. 3 illustrates the OO modeling tool 36, the design model 38, mapping system 40, metadata 42, the common repository 44, and application development tool 46 as resident in a single computer machine 30. In alternative embodiments, each of these elements 36, 38, 40, 42, 44, and 46 may be dispersed throughout different computer machines. For instance, a developer at a first machine may use the OO modeling tool 36 to create the design model 38. The model 38 may then be mapped to metadata 42 in the common repository 44. A separate machine executing the application development tool 46 may then access the common repository 44 to retrieve the metadata 42. The computers running the OO modeling tool 36 and application development tool 44 may be capable of communicating via a network system or, alternatively, unable to share data via a network.

Preferred embodiments were described as mapping object constructs to files, interfaces, modules, etc. However, in alternative embodiments, object constructs may be mapped to any type of data structure comprising an arrangement of data, including files, linked lists, interfaces, modules, classes, attributes, directories, etc.

In preferred embodiments, the mapping system 40 is illustrated as a separate program. In alternative embodiments, the mapping system 40 may be part of the OO modeling tool 36, the application development tool 46 or a stand alone program executing independently of the program tools 36, 46.

Preferred embodiments were described with respect to an object oriented programming environment, such as Java, Smalltalk, C++, etc. However, the mapping schemes of the preferred embodiments could apply to any programming environment regardless of the constructs and structures used to define the problem space.

Preferred embodiments were described as providing model context for classes. However, preferred embodiments maintain contextual information for any grouping of classes, whether such grouping be described as packages, subpackages, models, submodels, etc.

In preferred embodiments, a model is mapped to a file, a submodel is mapped to a module, and the classes are mapped to interfaces. In alternative embodiments, alternative mappings may occur as long as classes are mapped to a structure that preserves the model context for a class. For instance, models may be mapped to modules within a single file and the classes would be mapped to interfaces within the model modules. Those skilled in the art will appreciate that alternative mapping schemes may be utilized to preserve the model context when mapping the models and classes in order to preserve the structure of classes having the same name in different models.

In summary, preferred embodiments disclose a system for mapping objects defined in a design model to a common repository. A design model is provided that includes at least two models. A first model includes a first class and a second model includes a second class. The first class and second class have the same name, and the first class and second class have at least one different attribute and method. The first model, the first class, and attributes and methods therein are mapped to a first data structure that indicates that the first class is included with the first model. The second model, the second class, and attributes and methods therein are mapped to a second data structure that indicates that the second class is included with the second model. In this way, the first class and the second class are distinguished according to model in the data structures.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for mapping objects defined in a computer design model to a common repository in computer storage, comprising:

generating a computer design model defining at least two models, wherein a first model includes a first class and a second model includes a second class, wherein the first class and second class have the same name, and wherein the first class and second class have at least one different attribute, method, and relationship;

generating a first data structure in a computer readable medium including information on the first model, the first class, and attributes and methods therein;

generating information into the first data structure that indicates that the first class is associated with the first model; and generating a second data structure in the computer readable medium including information on the second model, the second class, and attributes and methods therein;

generating information into the second data structure that that indicates that the second class is associated with the second model, wherein the first class and the second class are distinguished according to the information on the associated model in the data structures.

2. The method of claim 1, wherein the step of providing a design model further comprises providing at least one additional class associated with the first model, wherein the additional class inherits attributes and methods from the first class, wherein the step of generating the first data structure comprises indicating in a table an inheritance relationship between the additional class and the first class.

3. The method of claim 1, wherein the first data structure comprises a first file and wherein the second data structure comprises a second file, wherein generating the first data structure comprises generating information on the first model to the first file and the first class to an interface within the first file, and the attributes and methods for the first class to fields related to the interface, and wherein generating the second data structure comprises generating information on the second model to the second file and the second class to an interface within the second file, and the attributes and methods for the second class to fields related to the interface.

4. The method of claim 1, further comprising:

displaying in a graphical user interface (GUI) a graphical representation of the first and second models, the first and second classes, and the attributes and methods of the first and second classes as stored in the common repository;

displaying in the GUI the first class as associated with the first model and the attributes and methods of the first class as associated with the first class; and displaying in the GUI the second class as associated with the second model and the attributes and methods of the second class as associated with the second class.

5. A method for mapping objects defined in a computer design model to a common repository in computer storage, comprising:

generating a computer design model defining at least two models, wherein a first model includes a first class and a second model includes a second class, wherein the first class and second class have the same name, and wherein the first class and second class have at least one different attribute, method, and relationship;

generating a first submodel and second submodel for the first model, wherein the first submodel groups the first class and additional classes and wherein the second submodel groups classes;

generating a first file in a computer readable medium including information on the first model, the first class, and attributes and methods therein;

generating information into the first file that indicates that the first class is associated with the first model;

generating information on the first submodel in a first module within the first file;

generating information on the first class and additional classes grouped by the first submodel to data structures within the first module;

generating information on the second submodel to a second module within the first file;

generating information on the classes grouped by the second submodel to data structures within the second module;

generating information on the second model, the second class and attributes and methods thereof to a second file in the computer readable medium, whereby the first and second models are mapped to the first and second files, respectively; and generating information into the second file that indicates that the second class is associated with the second model, wherein the first class and the second class are distinguished according to the information on the associated model in the files.

6. The method of claim 5, wherein the first module has a same name as the first submodel.

7. The method of claim 5, wherein the step of generating information on the second model comprises the additional steps of:

generating information on the second model to a third module within the second file, wherein the third module has a same name as the second model; and generating information on the second class and attributes and methods thereof to data structures within the third module within the second file.

8. The method of claim 5, wherein generating information on the first class and additional classes associated with first submodel comprises generating information on each class in a class interface within the first module and generating information on the attributes and methods for each class to fields associated with the class interface, wherein the step of generating information on the classes grouped by the second submodel comprises generating information on each class to a class interface within the second module and generating information on the attributes and methods for each class to fields associated with the class interface, and wherein the step of generating information on the second class comprises generating information on the second class to an interface within the second file and generating information on the attributes and methods of the second class to fields associated with the interface.

9. A system for mapping objects defined in a design model to a common repository, comprising:

a computer;

a memory device accessible to the computer including a design data structure including at least two models, wherein a first model includes a first class and a second model includes a second class, wherein the first class and second class have the same name, and wherein the first class and second class have at least one different attribute, method, and relationship; program logic executed by the computer, comprising:

(i) means for processing the design data structure;

(ii) means for generating a first data structure including information on the first model, the first class, and attributes and methods therein and information that indicates that the first class is associated with the first model; and (iii) means for generating a first data structure including information on the second model, the second class, and attributes and methods therein and information that indicates that the second class is associated with the second model, wherein the first class and the second class are distinguished according to the information on the associated model in the data structures.

10. The system of claim 9, wherein the design data structure further includes at least one additional class associated with the first model, wherein the additional class inherits attributes and methods from the first class, and wherein the program logic further includes means for indicating an inheritance relationship between the additional class and the first class.

11. The system of claim 9, wherein the first data structure comprises a first file and wherein the second data structure comprises a second file, wherein the means for generating the first data structure comprises generating information on the first model to the first file and the first class to an interface within the file, and the attributes and methods for the first class to fields related to the interface; and wherein the means for generating the second data structure comprises means for generating information on the second model to the second file and the second class to an interface within the second file, and the attributes and methods for the second class to fields related to the interface.

12. The system of claim 9, further comprising a display monitor in communication with the computer, wherein the program logic further includes:

means for displaying in a graphical user interface (GUI) on the display monitor a graphical representation of the first and second models, the first and second classes, and the attributes and methods of the first and second classes as stored in the common repository;

means for displaying in the GUI the first class as associated with the first model and the attributes and methods of the first class as associated with the first class; and means for displaying in the GUI the second class as associated with the second model and the attributes and methods of the second class as associated with the second class.

13. A system for mapping objects defined in a design model to a common repository, comprising:

a computer;

a memory device accessible to the computer including a design data structure including at least two models, wherein a first model includes a first class and a second model includes a second class, wherein the first class and second class have the same name, and wherein the first class and second class have at least one different attribute, method, and relationship, wherein the design data structure further includes a first submodel and second submodel for the first model, wherein the first submodel groups the first class and additional classes and wherein the second submodel groups classes;

program logic executed by the computer, comprising:

(i) means for processing the design data structure;

(ii) means for generating a first file including information on the first model, the first class, and attributes and methods therein and information that indicates that the first class is associated with the first model;

(iii) means for generating information on the first submodel to a first module within the first file;

(iii) means for generating information on the first class and additional classes grouped by the first submodel to data structures within the first module;

(iii) means for generating information on the second submodel to a second module within the first file;

(iv) means for generating information on the classes grouped by the second submodel to data structures within the second module; and (v) means for generating information on the second model to a second file and mapping the second class and attributes and methods thereof to the second file that indicates that the second class is associated with the second model, wherein the first class and the second class are distinguished according to the information on the associated model in the data structures.

14. The system of claim 13, wherein the first module has a same name as the first submodel.

15. The system of claim 13, wherein the program logic further includes:
   means for generating information on the second model to a third module within the second file, wherein the third module has a same name as the second model; and
   means for generating information on the second class and attributes and methods thereof to data structures within the third module within the second file.

16. The system of claim 13, wherein the program logic further includes:
   means for generating information on each class to an interface within the first module and generating information on the attributes and methods for each class to fields associated with the class interface;
   means for generating information on the classes grouped by the second submodel to interfaces within the second module and mapping the attributes and methods for each class to fields associated with the class interface; and
   means for generating information on the second class to an interface within the second file and generating information on the attributes and methods of the second class to fields associated with the interface.

17. An article of manufacture for use in programming a computer to map objects defined in a design model to a common repository, the article of manufacture comprising computer readable storage media accessible to the computer, wherein the computer readable storage media has at least one computer program embedded therein that causes the computer to perform:
   generating a computer design model defining at least two models, wherein a first model includes a first class and a second model includes a second class, wherein the first class and second class have the same name, and wherein the first class and second class have at least one different attribute, method, and relationship;
   generating a first data structure in a computer readable medium including information on the first model, the first class, and attributes and methods therein;
   generating information into the first data structure that indicates that the first class is associated with the first model; and
   generating a second data structure in the computer readable medium including information on the second model, the second class, and attributes and methods therein;
   generating information into the second data structure that that indicates that the second class is associated with the second model, wherein the first class and the second class are distinguished according to the information on the associated model in the data structures.

18. The article of manufacture of claim 17, wherein the step of providing a design model further comprises providing at least one additional class associated with the first model, wherein the additional class inherits attributes and methods from the first class, wherein the step of generating the first data structure further comprises indicating in a table an inheritance relationship between the additional class and the first class.

19. The article of manufacture of claim 17, wherein the first data structure comprises a first file and wherein the second data structure comprises a second file, wherein generating the first data structure comprises generating information on the first model to a first file and the first class to an interface within the first file, and the attributes and methods for the first class to fields related to the interface, and wherein generating the second data structure comprises generating information on the second model to a second file and the second class to an interface within the second file, and the attributes and methods for the second class to fields related to the interface.

20. The article of manufacture of claim 17, further comprising:
   displaying in a graphical user interface (GUI) a graphical representation of the first and second models, the first and second classes, and the attributes and methods of the first and second classes as stored in the common repository;
   displaying in the GUI the first class as associated with the first model and the attributes and methods of the first class as associated with the first class; and
   displaying in the GUI the second class as associated with the second model and the attributes and methods of the second class as associated with the second class.

21. An article of manufacture for use in programming a computer to map objects defined in a design model to a common repository, the article of manufacture comprising computer readable storage media accessible to the computer, wherein the computer readable storage media has at least one computer program embedded therein that causes the computer to perform:
   generating a computer design model defining at least two models, wherein a first model includes a first class and a second model includes a second class, wherein the first class and second class have the same name, and wherein the first class and second class have at least one different attribute, method, and relationship;
   generating a first submodel and second submodel for the first model, wherein the first submodel groups the first class and additional classes and wherein the second submodel groups classes;
   generating a first file in a computer readable medium including information on the first model, the first class, and attributes and methods therein;
   generating information into the first file that indicates that the first class is associated with the first model;
   generating information on the first submodel in a first module within the first file;
   generating information on the first class and additional classes grouped by the first submodel to data structures within the first module;
   generating information on the second submodel to a second module within the first file;
   generating information on the classes grouped by the second submodel to data structures within the second module; and
   generating information on the second model, the second class and attributes and methods thereof to a second file, whereby the first and second models are mapped to the first and second files, respectively, and wherein the first class and the second class are distinguished according to the information on the associated model in the data structures.

22. The article of manufacture of claim 21, wherein the first module has a same name as the first submodel.

23. The article of manufacture of claim 21, wherein the step of generating information on the second model comprises the additional steps of:

generating information on the second model to a third module within the second file, wherein the third module has a same name as the second model; and generating information on the second class and attributes and methods thereof to data structures within the third module within the second file.

24. The article of manufacture of claim 21, wherein generating information on the first class and additional classes associated with first submodel comprises generating information on each class in a class interface within the first module and generating information on the attributes and methods for each class to fields associated with the class interface, wherein the step of generating information on the classes grouped by the second submodel comprises generating information on each class to a class interface within the second module and generating information on the attributes and methods for each class to fields associated with the class interface, and wherein the step of generating information on the second class comprises generating information on the second class to an interface within the second file and generating information on the attributes and methods of the second class to fields associated with the interface.

25. A memory device storing data structures accessible to an application program, wherein the data structures include data mapped from a design model defining at least two models, wherein a first model includes a first class and a second model includes a second class, wherein the first class and second class have a same name, and wherein the first class and second class have at least one different attribute, method, and relationship, wherein the data structures comprise:

a first data structure, wherein the application program processes the design model to generate information on the first model, the first class, and attributes and methods therein to the first data structure that indicates that the first class is included with the first model; and a second data structure, wherein the application program processes the design model to generate information on the second model, the second class, and attributes and methods therein to the second data structure that indicates that the second class is included with the second model, wherein the first class and the second class are distinguished according to model in the data structures.

26. The memory device of 25, wherein the design model further includes at least one additional class associated with the first model, wherein the additional class inherits attributes and methods from that first class, further comprising a relationship table, wherein the application program processes the design model to indicate in the relationship table an inheritance relationship between the additional class and the first class.

27. The memory device of claim 25, wherein the design model further defines a first submodel and second submodel for the first model, wherein the first submodel groups the first class and additional classes and wherein the second submodel groups classes;

wherein the first data structure comprises a first file including a first module and a second module, wherein the application programs generates information on the first model to the first file, the first submodel to the first module within the first file and the second submodel to the second module within the first file; and wherein the second data structure comprises a second file, wherein the application program generate information on the second model to the second file.

28. The memory device of claim 27, wherein the first module has a same name as the first submodel.

29. The memory device of claim 25, wherein the first data structure further includes interfaces related to the first module and fields related to the interface, wherein the application program generates information on each class in the first submodel to an interface related to the first module and generates information on the attributes and methods for each class to fields related with the class interface, wherein the application program generate information on the classes grouped by the second submodel to interfaces within the second module and generates information on the attributes and methods for each class to fields associated with the class interface, and wherein the second data structure further includes an interface and related fields, wherein the application program generates information on the second class to an interface within the second file and maps the attributes and methods of the second class to fields related to the interface.

30. A memory device storing data structures accessible to an application program, wherein the data structures include data mapped from a design model defining at least two models, wherein a first model includes a first class and a second model includes a second class, wherein the first class and second class have a same name, and wherein the first class and second class have at least one different attribute, method, and relationship, wherein the design model further defines a first submodel and second submodel for the first model, wherein the first submodel groups the first class and additional classes and wherein the second submodel groups classes, wherein the data structures comprise:

a first file, wherein the application program processes the design model to generate information on the first model, the first class, and attributes and methods therein to the first file that indicates that the first class is included with the first model, wherein the first file includes a first module and a second module, wherein the application program generates information on the first model to the first file, the first submodel to the first module within the first file and the second submodel to the second module within the first file; and a second file, wherein the application program processes the design model to generate information on the second model, the second class, and attributes and methods therein to the second file that indicates that the second class is included with the second model, wherein the first class and the second class are distinguished according to model in the data structures.

31. A method for mapping objects defined in a computer design model to a common repository in computer storage, comprising:

generating a computer design model defining at least two models, wherein each model is capable of including one or more classes, and wherein each class is capable of including one or more attributes, methods, and relationships;

for each computer design model, generating a data structure in a computer readable medium including information on each class in the model; and for each class in the model for which information is generated, generating in the data structure information on each attribute, method, and relationship of the class and information associating each class with the model including the class, whereby each data structure includes sufficient information to distinguish classes in different models by model.

32. The method of claim 31, wherein for each data structure, the information on the model, classes, and attributes, methods and relationships of the classes comprises information associating a name of the model to a first level in the data structure, information associating each class in the model to a second level in the data structure defined within the first level, and information associating each attribute, method, and relationship of each class with a third level defined within the second level to which the class including each attribute, method, and relationship is associated.

33. The method of claim 31, wherein each model is further capable of including one or more submodels and wherein each submodel is capable of including one or more classes, wherein for each design model, further performing:

generating into the data structure for the design model information on each submodel in the model; and for each class in the model that is included in one submodel, generating information into the data structure associating the class, and all the attributes, methods, and relationships thereof, with the submodel.

34. The method of claim 33, wherein for each model data structure, the information on the model, submodels, classes, and attributes, methods and relationships thereof, comprises information associating each submodel to a first level in the data structure, information associating each class in each submodel to a second level in the data structure defined within the first level to which the submodel of the class is associated, and information associating each attribute, method, and relationship of each class with a third level defined within the second level to which the class including each attribute, method, and relationship is associated.

35. The method of claim 33, wherein if the design model does not include one submodel, then generating information associating the model to the first level.

36. The method of claim 31, wherein the computer readable medium comprises a memory device, further comprising:

writing each data structure in the computer readable medium to a separate file in the common repository, wherein the common repository is stored in a storage device.

* * * * *

UNITED STATES PATENT AND TRADEMARK OFFICE
CERTIFICATE OF CORRECTION

PATENT NO. : 6,343,265 B1
DATED : January 29, 2002
INVENTOR(S) : Alexander Glebov and Rebecca Lau It is certified that error appears in the above-identified patent and that said Letters Patent is hereby corrected as shown below:

Column 10,
Line 1, delete "that" (second occurrence).
Lines 50, 53, 56, 61 and 66, delete "file" and insert -- data structure --.

Column 11,
Lines 2 and 8, delete "files" and insert -- data structures --.
Line 4, delete "file" and insert -- data structure --.

Column 12,
Lines 46 and 61, delete "file" and insert -- data structure in the memory device --.
Lines 51, 56 and 62, delete "file" and insert -- data structure --.

Column 13,
Line 51, delete "that" (second occurrence).

Column 14,
Lines 40, 43, 46, 58 and 59, delete "file" and insert -- data structure --.

Column 16,
Lines 30, 34, 37, 38, 39, 40 and 43, delete "file" and insert -- data structure --.

Signed and Sealed this

Twenty-seventh Day of September, 2005

JON W. DUDAS
*Director of the United States Patent and Trademark Office*